US009337612B2

(12) United States Patent  
Eckert

(10) Patent No.: US 9,337,612 B2  
(45) Date of Patent: May 10, 2016

(54) LASER COMPONENT AND METHOD FOR ITS PRODUCTION

(71) Applicant: OSRAM Opto Semiconductors GmbH, Regensburg (DE)

(72) Inventor: Tilman Eckert, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/798,999

(22) Filed: Jul. 14, 2015

(65) Prior Publication Data

US 2015/0318664 A1 Nov. 5, 2015

Related U.S. Application Data

(63) Continuation of application No. PCT/EP2014/051255, filed on Jan. 22, 2014.

(30) Foreign Application Priority Data

Feb. 6, 2013 (DE) .......................... 10 2013 201 931

(51) Int. Cl.
*H01S 5/022* (2006.01)
*H01L 33/48* (2010.01)
*H01L 33/62* (2010.01)

(52) U.S. Cl.
CPC ......... *H01S 5/02208* (2013.01); *H01S 5/02228* (2013.01); *H01S 5/02272* (2013.01); *H01S 5/02276* (2013.01); *H01L 33/486* (2013.01); *H01L 33/62* (2013.01); *H01L 2224/48091* (2013.01); *H01S 5/02236* (2013.01); *Y10T 29/49147* (2015.01)

(58) Field of Classification Search
CPC ............ H01S 5/02208; H01S 5/02272; H01S 5/02228; H01S 5/02276
See application file for complete search history.

(56) References Cited

U.S. PATENT DOCUMENTS

| 5,035,483 A | 7/1991 | Waitl et al. |
| 5,844,257 A | 12/1998 | Chen |
| 2002/0110171 A1* | 8/2002 | Wickstrom ......... H01S 5/02296 372/43.01 |
| 2003/0223709 A1* | 12/2003 | Lake .................... G02B 6/4248 385/94 |

(Continued)

FOREIGN PATENT DOCUMENTS

DE 10 2011 116 534 A1 4/2013

OTHER PUBLICATIONS

International Search Report dated Apr. 22, 2014 from corresponding International Patent Application No. PCT/EP2014/051255.

*Primary Examiner* — Dung Nguyen  
(74) *Attorney, Agent, or Firm* — DLA Piper LLP (US)

(57) ABSTRACT

A laser component includes a housing and a laser chip arranged in the housing, wherein the housing includes a first soldering contact and a second soldering contact at a first outer surface, and a third soldering contact and a fourth soldering contact at a second outer surface, the first soldering contact connects to the third soldering contact in an electrically conductive manner and the second soldering contact connects to the fourth soldering contact in an electrically conductive manner, the housing includes a carrier substrate and a cover, a bottom side of the laser chip is arranged on the carrier substrate, the cover includes an encapsulation material, the laser chip is covered by the encapsulation material, and a beam direction of the laser chip is oriented in parallel to the bottom side of the laser chip.

10 Claims, 6 Drawing Sheets

(56) References Cited

U.S. PATENT DOCUMENTS

| | | |
|---|---|---|
| 2007/0269927 A1 | 11/2007 | Hofer et al. |
| 2007/0284708 A1 | 12/2007 | Hanya |
| 2010/0002403 A1 * | 1/2010 | Loibl ............... H05K 1/147 361/749 |
| 2011/0079801 A1 | 4/2011 | Zhang et al. |
| 2014/0307755 A1 | 10/2014 | Wojcik et al. |

\* cited by examiner

LASER COMPONENT AND METHOD FOR ITS PRODUCTION

TECHNICAL FIELD

This disclosure relates to a laser component as well as to a method of producing a laser component. DE 10 2013 201 931.9 which explicitly constitutes a part of this disclosure also describes a laser component and a method of producing a laser component.

BACKGROUND

Laser components configured to emit laser radiation perpendicular to a mounting surface (top-looker arrangement) as well as to laser components intended to emit laser radiation in parallel to a mounting surface (side-looker arrangement) are known. It is also known to configure these types of laser components with respective specialized housings. It is furthermore known to configure laser components as radial components for a push-through installation in top-looker arrangements. For mounting in a side-looker arrangement, wire connections of such laser components may be bent prior to mounting which, however, involves an additional process step.

It could therefore be helpful to provide an improved laser component and a method of producing a laser component.

SUMMARY

I provide a laser component comprising:
a housing and a laser chip arranged in the housing, wherein
the housing comprises a first soldering contact and a second soldering contact at a first outer surface, and a third soldering contact and a fourth soldering contact at a second outer surface,
the first soldering contact connects to the third soldering contact in an electrically conductive manner and the second soldering contact connects to the fourth soldering contact in an electrically conductive manner,
the housing comprises a carrier substrate and a cover,
a bottom side of the laser chip is arranged on the carrier substrate,
the cover comprises an encapsulation material,
the laser chip is covered by the encapsulation material, and
a beam direction of the laser chip is oriented in parallel to the bottom side of the laser chip.

I further provide a method of producing a laser component comprising:
producing a carrier substrate having a first outer surface and a second outer surface;
arranging a first soldering contact and a second soldering contact at the first outer surface,
arranging a third soldering contact and a fourth soldering contact at the second outer surface, wherein the first soldering contact connects to the third soldering contact in an electrically conductive manner and the second soldering contact connects to the fourth soldering contact in an electrically conductive manner;
arranging a bottom side of a laser chip on the carrier substrate, wherein a beam direction of the laser chip is oriented in parallel to the bottom side of the laser chip; and
covering the laser chip by a cover formed by encapsulating the laser chip in an encapsulation material.

Figure 1:
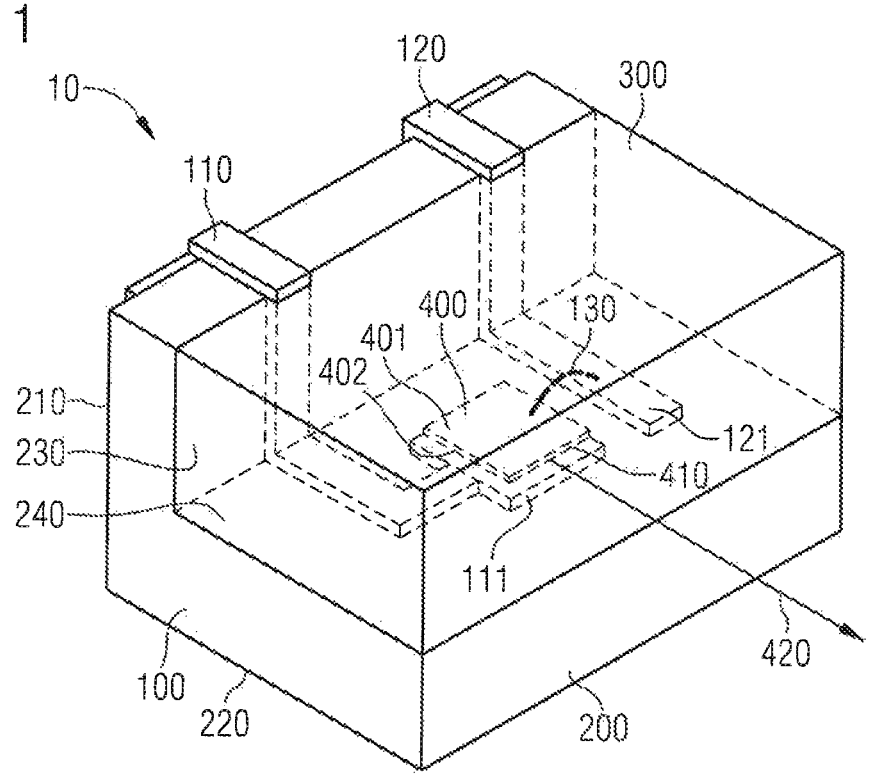
FIG. 1 shows a view of a first laser component in a first perspective.

REFERENCE LIST 10 first laser component
20 second laser component
30 third laser component
100 housing
110 first metallization
111 chip-mounting surface
112 first soldering contact
113 third soldering contact
120 second metallization
121 bond surface
122 second soldering contact
123 fourth soldering contact
130 bond wire
200 carrier substrate
210 first outer surface
220 second outer surface
230 first internal surface
240 second internal surface
300 first cover
310 second cover
311 cavity
400 laser chip
401 upper side
402 bottom side
410 laser facet
420 beam direction
500 printed circuit board
510 first soldering surface
520 second soldering surface

DETAILED DESCRIPTION

My laser component comprises a housing and a laser chip arranged in the housing. At a first outer surface, the housing comprises a first soldering contact and a second soldering contact. At a second outer surface, the housing comprises a third soldering contact and a fourth soldering contact. The first soldering contact connects to the third soldering contact in an electrically conductive manner and the second soldering contact connects to the fourth soldering contact in an electrically conductive manner. The housing comprises a carrier substrate and a cover. A bottom side of the laser chip is arranged on the carrier substrate. The cover comprises an encapsulation material. The laser chip is covered by the encapsulation material. A beam direction of the laser chip is oriented in parallel to the bottom side of the laser chip.

Advantageously, this laser component is suited for use as an SMD component for surface mounting by reflow soldering. In this context, the laser component may either be soldered to the first and to the second soldering contact or to the third and to the fourth soldering contact. Accordingly, in this laser component either the first outer surface of the housing or the second outer surface of the housing may face a mounting surface. Both arrangements involve varying orientations of a laser beam emitted from the laser chip of the laser component. As a result, the laser component is advantageously highly flexible and its possibilities of application are very versatile. The housing of the laser component may advantageously be manufactured inexpensively. Advantageously, the laser chip is protected against damage by outside influences by the cover.

The first outer surface and the second outer surface may be arranged perpendicular to each other. Advantageously, the laser component may thus be mounted in two respectively perpendicular orientations. These respectively perpendicular orientations involve two respectively vertical orientations of a property of a laser beam emitted by the laser chip. For example, the laser beam emitted by the laser chip may be emitted in a different spatial direction in the two orientations of the laser component, or a beam profile of the laser beam emitted by the laser chip may have respectively vertical orientations in the two orientations of the laser component.

The beam direction may be oriented perpendicular to the first outer surface and in parallel to the second outer surface. Advantageously, this laser component may emit laser radiation vertically with regard to a mounting surface during mounting at the soldering contacts of the first outer surface of the housing and it may emit laser radiation in parallel with regard to a mounting surface during mounting at the soldering contacts of the second outer surface. As a result, the laser component is suitable for use in a top-looker arrangement as well as for use in a side-looker arrangement.

The beam direction may be oriented in parallel to the first outer surface and to the second outer surface. Advantageously, a profile geometry of the laser radiation emitted by the laser chip of this laser component has a respectively vertical orientation in the two possible mounting positions of the laser component. Thereby, the laser component may be mounted in an orientation ideal for the respective specific purpose of application.

The first outer surface and the second outer surface may be formed by the carrier substrate. Advantageously, the carrier substrate may be produced simply and inexpensively e.g. by injection molding. The soldering contacts may then be arranged at the outer surfaces of the carrier substrate in a simple and inexpensive manner.

The laser component may be configured as a surface-mountable component. Advantageously, the laser component may then be mounted simply and inexpensively by reflow soldering. Advantageously, the laser component is also suitable for use in a pick-and-place process.

My method of producing a laser component comprises steps of producing a carrier substrate having a first outer surface and a second outer surface, arranging a first soldering contact and a second soldering contact at the first outer surface as well as arranging a third soldering contact and a fourth soldering contact at the second outer surface, the first soldering contact being connected to the third soldering contact in an electrically conductive manner and the second soldering contact being connected to the fourth soldering contact in an electrically conductive manner, arranging a bottom side of a laser chip on the carrier substrate, a beam direction of the laser chip being oriented in parallel to the bottom side of the laser chip, and covering the laser chip with a cover formed by encapsulating the laser chip in an encapsulation material.

Advantageously, the method may be carried out inexpensively and is suitable for mass production. The laser component obtained according to this method may advantageously be mounted in two different orientations, either the first outer surface or the second outer surface of the carrier substrate facing a mounting surface. Advantageously, the laser chip of the laser component produced according to this method is differently oriented in the two possible mounting orientations. As a result, the laser component produced by this method may be used in a flexible manner. Advantageously, the laser chip of the laser component produced according to this method is protected against damage due to outside influences by the cover.

The carrier substrate is produced by injection molding. Advantageously, the method may thereby be carried out in a particularly simple and inexpensive manner.

The laser chip is arranged on the carrier substrate such that the beam direction is oriented perpendicular to the first outer surface and in parallel to the second outer surface. Advantageously, the laser component obtainable by this method is thus suitable for mounting in a top-looker arrangement in which a laser beam may be emitted perpendicular to a mounting surface, as well as for mounting in a side-looker arrangement in which a laser beam may be emitted in parallel to a mounting surface.

The laser chip may be arranged on the carrier substrate such that the beam direction is oriented in parallel to the first outer surface and to the second outer surface. Advantageously, the laser component obtainable by the method may then be mounted in two different orientations. In both of the different orientations, a beam profile of the laser radiation emitted in the beam direction has different orientations.

The above-described properties, features and advantages as well as the manner in which they are achieved will become clearer in context with the following description of examples which will be explained in more detail in conjunction with the drawings.

Figure 2:
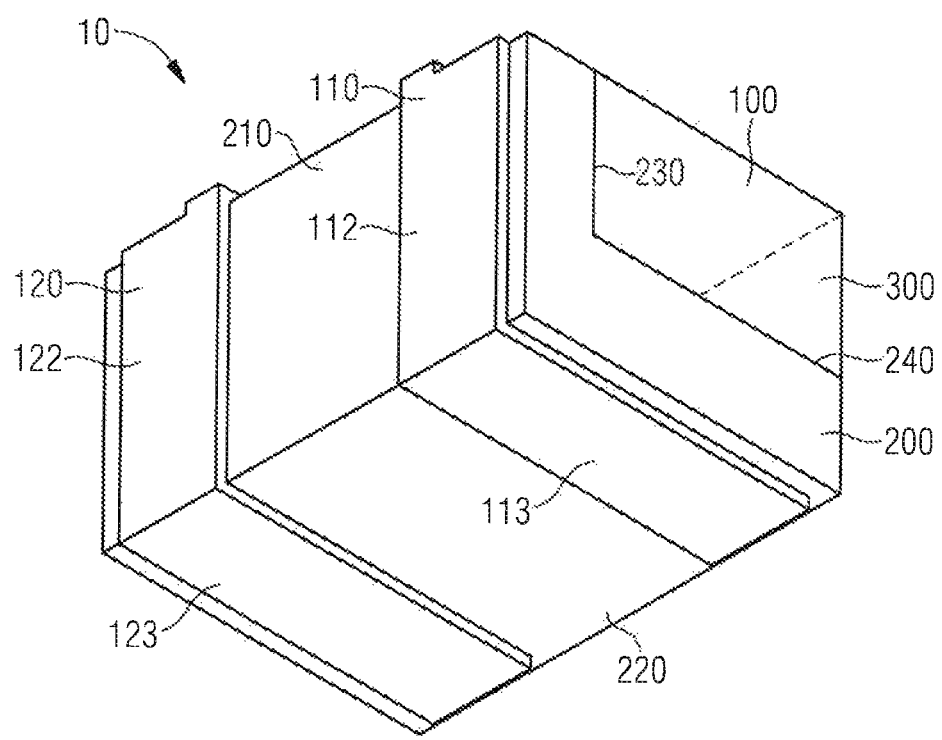
FIG. 2 depicts a view of the first laser component in a second perspective.

FIG. 1 shows a schematic perspective view of a first laser component 10 in a first perspective. FIG. 2 depicts a view of the first laser component 10 in a second perspective. The first laser component 10 may also be referred to as laser package.

The first laser component 10 comprises a housing 100 having an approximately box-shaped basic shape. The housing 100 comprises a carrier substrate 200 and a first cover 300. The carrier substrate 200 comprises an L-shaped or, respectively, angular profile. The first cover 300 has a box-shape and complements the angular carrier substrate 200 to form a box-shaped housing 100.

The carrier substrate 200 consists of an electrically isolating material, e.g. a plastic. The carrier substrate 200 may e.g. have been produced by injection molding using MID technology. The carrier substrate 200 comprises a first outer surface 210, a second outer surface 220, a first internal surface 230 and a second internal surface 240. The first outer surface 210 and the second outer surface 220 of the carrier substrate 200 are arranged perpendicular to each other. The first outer surface 210 and the second outer surface 220 form sides of the carrier substrate 200 which face away from the first cover 300. The first internal surface 230 and the second internal surface 240 are arranged perpendicular to each other and face the first cover 300. The first internal surface 230 is arranged in parallel to the first outer surface 210. The second internal surface 240 is arranged in parallel to the second outer surface 220.

The carrier substrate 200 comprises a first metallization 110 and a second metallization 120. The first metallization 110 and the second metallization 120 each comprise an electrically conductive material, e.g. a metal. The first metallization 110 and the second metallization 120 are electrically isolated from each other. The first metallization 110 as well as the second metallization 120 extend from the second internal surface 240 via the first internal surface 230 and the first outer surface 210 up to the second outer surface 220 of the carrier substrate as conductors.

The first metallization 110 comprises a chip-mounting surface 111, a first soldering contact 112 and a third soldering contact 113. The chip-mounting surface 111 is formed as a rectangular or box-shaped surface and arranged at the second internal surface 240 of the carrier substrate 200. The first soldering contact 112 is formed as an e.g. rectangular strip and arranged at the first outer surface 210 of the carrier substrate 200. The third soldering contact 113 is formed e.g. as a rectangular surface and arranged at the second outer surface 220 of the carrier substrate 200. The chip-mounting surface 111, the first soldering contact 112 and the third soldering contact 113 of the first metallization 110 each connect to one another in an electrically conductive manner.

The second metallization 120 comprises a bond surface 121, a second soldering contact 122 and a fourth soldering contact 123. The bond surface 121 is e.g. formed as a rectangular or square surface and arranged at the second internal surface 240 of the carrier substrate 200. The second soldering contact 122 is e.g. formed as a rectangular surface and arranged at the first outer surface 210 of the carrier substrate 200. The fourth soldering contact 123 is formed as an e.g. rectangular surface and arranged at the second outer surface 220 of the carrier substrate 200. The bond surface 121, the second soldering contact 122 and the fourth soldering contact 123 of the second metallization 120 each connect to one another in an electrically conductive manner.

On the chip-mounting surface 111 at the second internal surface 240 of the carrier substrate 200, a laser chip 400 is arranged. The laser chip 400 is formed as a semiconductor chip with an integrated laser structure. The laser chip 400 has an upper side 401 and a bottom side 402 opposite to the upper side 401. At the upper side 401 and the bottom side 402 of the laser chip 400, an electrical contact that electrically contacts the laser chip 400 is respectively arranged. The bottom side 402 of the laser chip 400 faces the chip-mounting surface 111 such that the chip-mounting surface 111 connects to the electrical contact arranged at the bottom side 402 of the laser chip 400 in an electrically conductive manner. The laser chip 400 may e.g. be soldered to the chip-mounting surface 111. The electrical contact of the laser chip 400 arranged at the upper side 401 of the laser chip 400 connects to the bond surface 121 at the second internal surface 240 of the carrier substrate 200 in an electrically conductive manner by a bond wire 130.

The laser chip 400 comprises a laser facet 410 arranged perpendicularly to the upper side 401 and to the bottom side 402 of the laser chip 400. The laser chip 400 is configured to emit laser radiation in a beam direction 420 during operation. The beam direction 420 is oriented perpendicularly to the laser facet 401. Thus, the beam direction 420 is also oriented perpendicularly to the first outer surface 210 of the carrier substrate 200 and to the first internal surface 430 of the carrier substrate 200 and leads away from the first internal surface 230 of the carrier substrate 200. Furthermore, the beam direction 420 is oriented in parallel to the second internal surface 240 and to the second outer surface 220 of the carrier substrate 200.

The laser chip 400 has to be charged with an electric voltage to operate the first laser component 10. For this purpose, the electric voltage must be applied between the first metallization 110 and the second metallization 120 of the housing 100. The electric voltage may either be applied between the first soldering contact 112 and the second soldering contact 122 at the first outer surface 210 of the carrier substrate 200 or between the third soldering contact 113 and the fourth soldering contact 123 at the second outer surface 220 of the carrier substrate 200. The soldering contacts 112, 113, 122, 123 are suitable for electrical contacting by reflow soldering.

The first cover 300 of the first laser component 10 comprises a material which is transparent for the laser radiation emitted by the laser chip 400. The first cover 300 covers the first internal surface 230 and the second internal surface 240 of the carrier substrate 200. The first cover 300 is produced of an encapsulation material. The laser chip 400 and the bond wire 130 are encapsulated in the encapsulation material of the first cover 300. As a result, the laser chip 400 and the bond wire 130 are protected against mechanical damage and against contamination.

Figure 3:
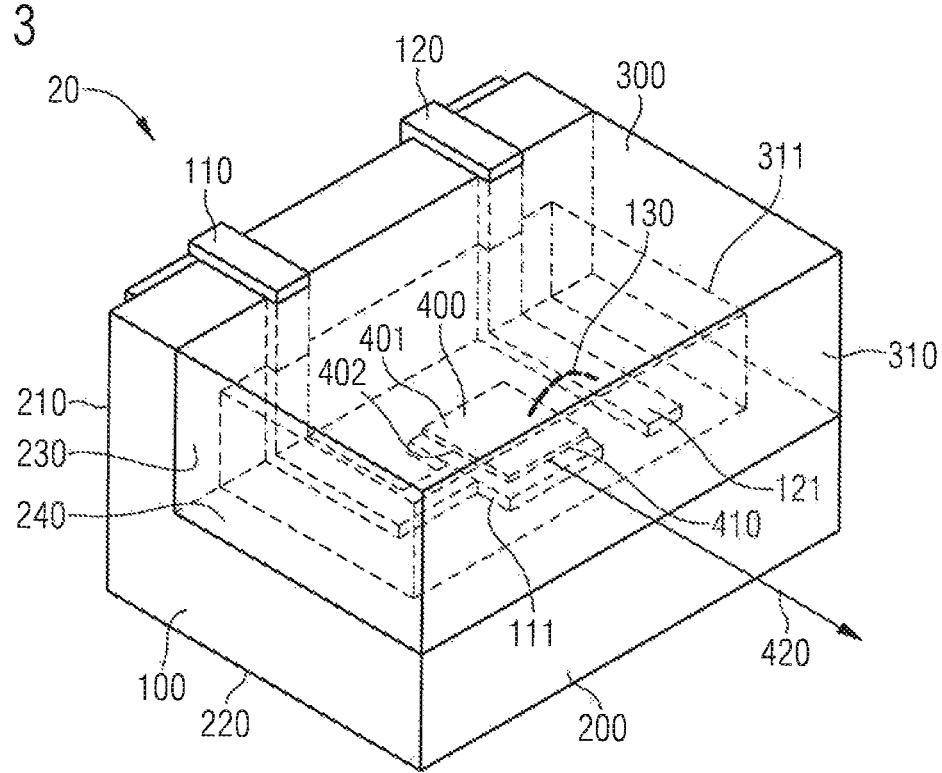
FIG. 3 shows a view of the second laser component.

FIG. 3 shows a schematic perspective view of a second laser component 20. The second laser component 20 largely corresponds to the first laser component 10 of FIGS. 1 and 2. In all the Figures, corresponding elements have been assigned the same reference numerals and are not described in detail again in the following description.

In contrast to the first laser component 10, the second laser component 20 has a second cover 310 instead of the first cover 300. The second cover 310 completes the carrier substrate 200 to form the box-shaped housing 100 of the second laser component 20. The second cover 310 encases the laser chip 400 between the carrier substrate 200 and the second cover 310. The second cover 310 comprises a cavity 311 surrounding the laser chip 400. The laser chip 400 is thus arranged within the cavity 311 between the carrier substrate 200 and the second cover 310. The second cover 310 comprises a material which is transparent for a laser radiation emitted by the laser chip 400. The second cover 310 may e.g. be produced by injection molding. The second cover 310 may e.g. be glued to the first internal surface 230 and the second internal surface 240 of the carrier substrate 200 of the second laser component 20.

Figure 4:
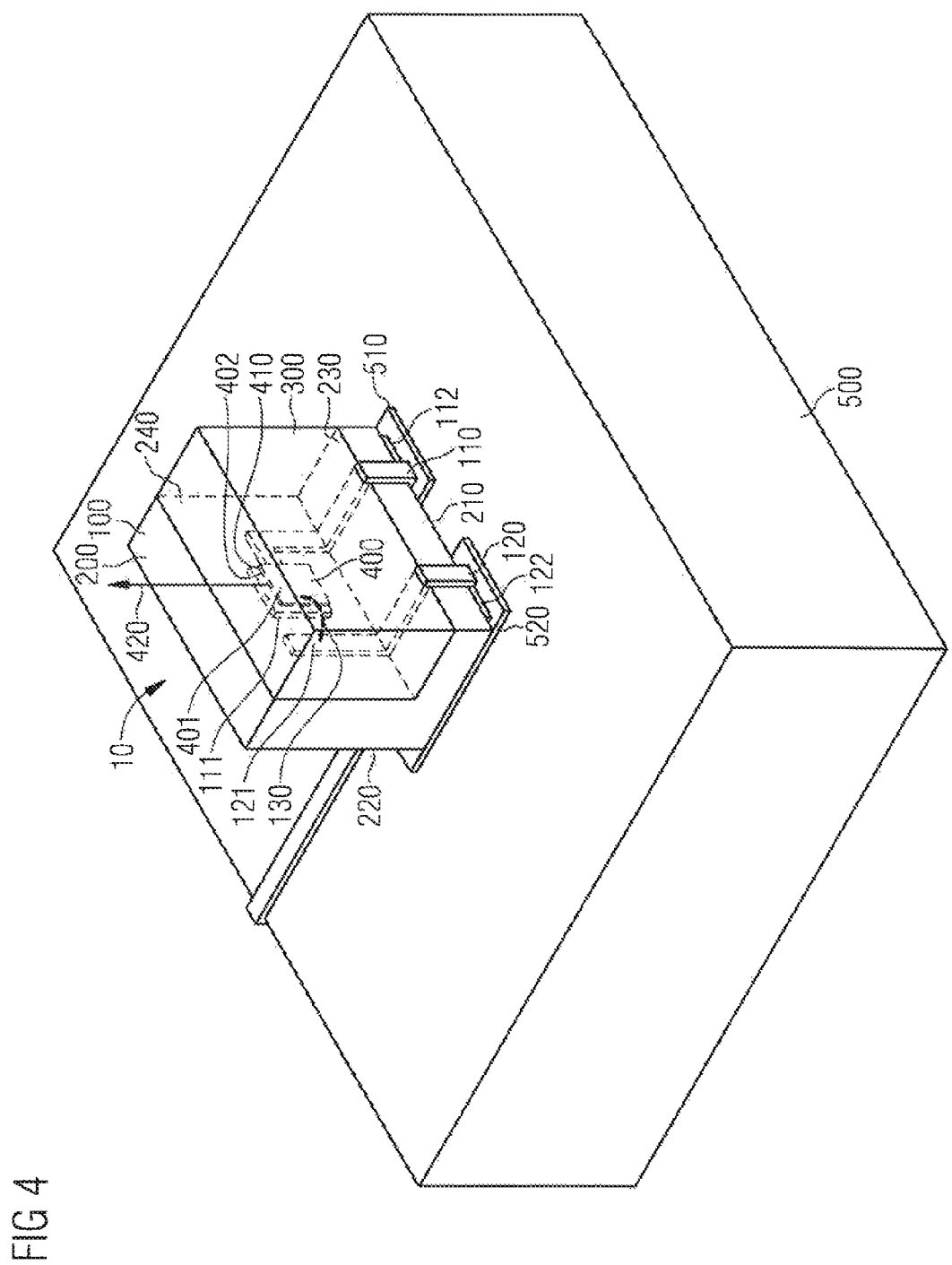
FIG. 4 shows the first laser component in a first mounting orientation.

FIG. 4 shows a schematic perspective view of the first laser component 10 in a first mounting arrangement. In the view of FIG. 4, the first laser component 10 is mounted in a top-looker arrangement.

The first laser component 10 is arranged on a printed circuit board 500 depicted only schematically. The printed circuit board 500 comprises a first soldering surface 510 and a second soldering surface 520 at its upper side. The first laser component 10 is arranged on the printed circuit board 500 such that the first outer surface 210 of the carrier substrate 200 of the first laser component 10 is arranged on the surface of the printed circuit board 500. The first soldering contact 112 at the first outer surface 210 of the carrier substrate 200 connects to the first soldering surface 510 of the printed circuit board 500 in an electrically conductive manner, e.g. by a soldering connection. The second soldering contact 122 at the first outer surface 210 of the carrier substrate 200 of the first laser component 10 connects to the second soldering surface 520 of the printed circuit board 500, e.g. by a soldering joint. The electrically conductive connection between the soldering contacts 112, 122 at the first outer surface 210 of the carrier substrate 200 and the soldering surfaces 510, 520 of the printed circuit board 500 may have been produced e.g. by reflow soldering.

In the arrangement of the first laser component 10 shown in FIG. 4, the first laser chip 400 is arranged relative to the printed circuit board 500 such that the beam direction 420 of the laser chip 400 is oriented perpendicularly to the surface of the printed circuit board 500. When operated, the first laser component 10 thus emits laser radiation perpendicularly to the surface of the printed circuit board 500 in the arrangement of FIG. 4.

Figure 5:
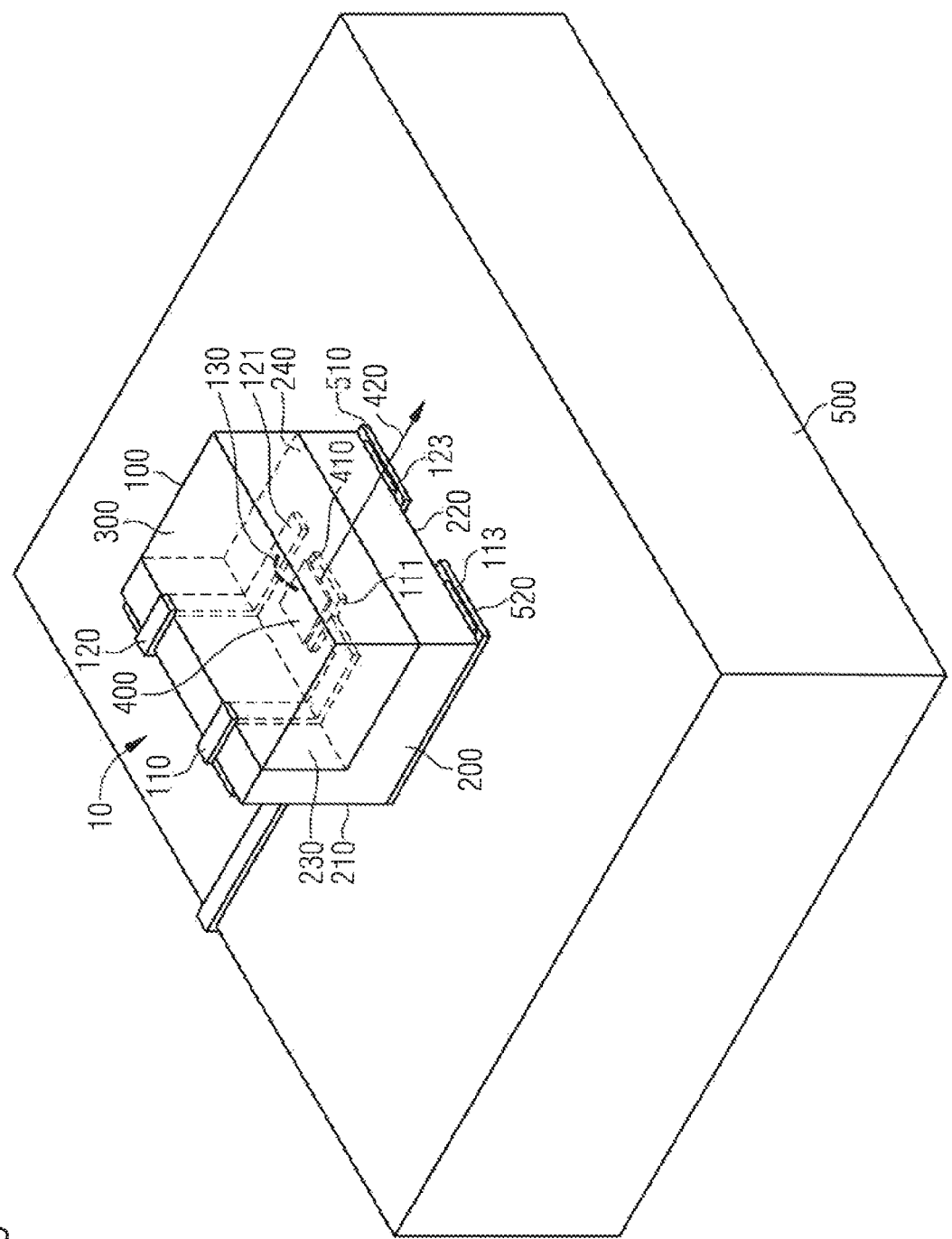
FIG. 5 shows the first laser component in a second mounting orientation.

FIG. 5 shows a further schematic view of the first laser component 10 in a second mounting arrangement. In the depiction of FIG. 5, the first laser component 10 is in a side-looker arrangement.

The first laser component 10 is arranged on the surface of the printed circuit board 500 such that the second outer surface 220 of the carrier substrate 200 of the first laser component 10 faces the surface of the printed circuit board 500. The third soldering contact 113 at the second outer surface 220 of the first laser component 10 connects to the second soldering surface 520 of the printed circuit board 500 in an electrically conductive manner. The fourth soldering contact 123 at the second outer surface 220 of the first laser component 10 connects to the first soldering surface 510 of the printed circuit board 500 in an electrically conductive manner. The laser chip 400 of the first laser component 10 is oriented such that the beam direction 420 of the laser chip 400 is oriented in parallel to the surface of the printed circuit board 500.

Figure 6:
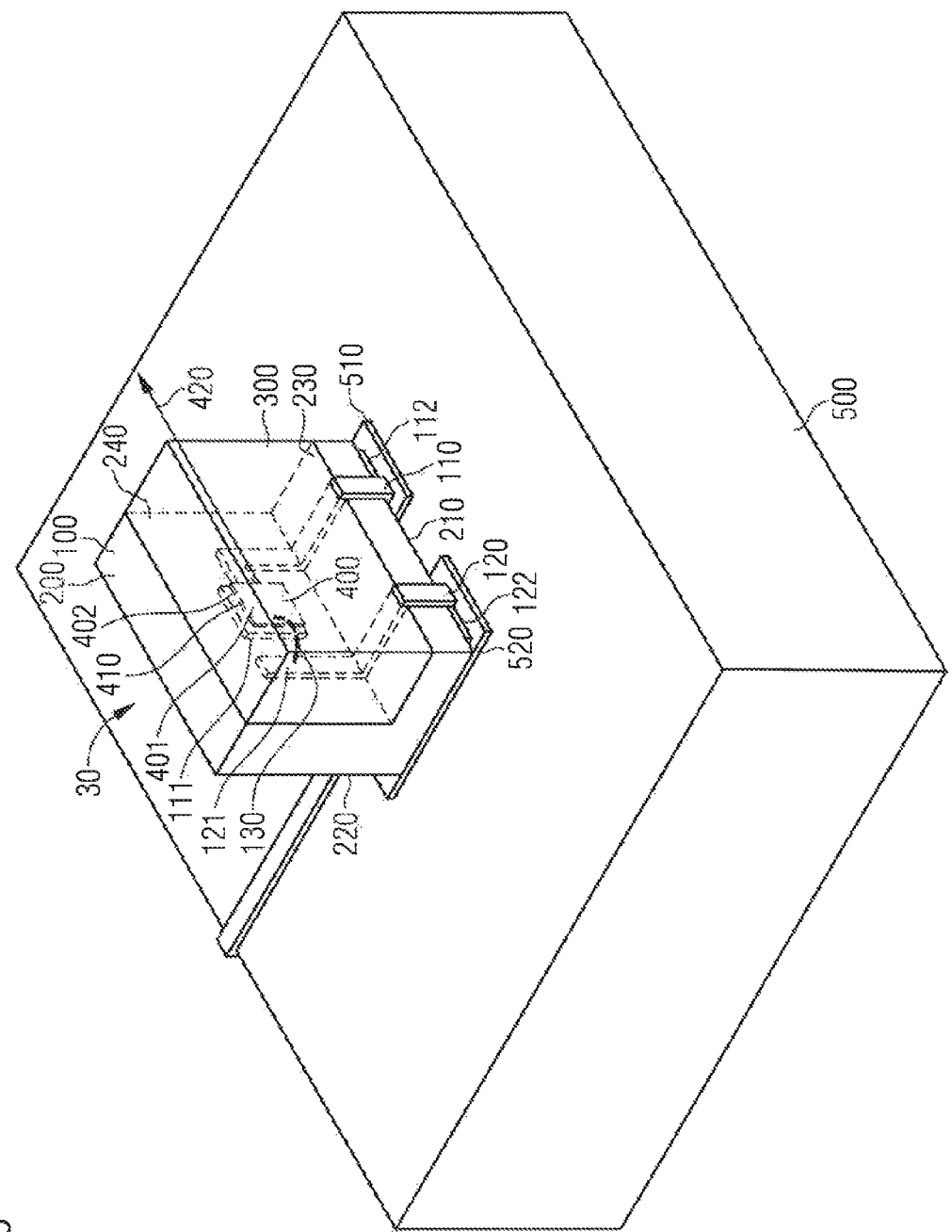
FIG. 6 depicts a third laser component in a first mounting orientation.

FIG. 6 shows a schematic perspective view of a third laser component 30. The third laser component 30 largely corresponds to the first laser component 10 of FIGS. 1 and 2. In FIGS. 1, 2 and 6, corresponding components have been assigned the same reference numerals and will not be described in detail again in the following description.

The third laser component 30 differs from the first laser component 10 in that the laser chip 400 is in the third laser component 30 arranged on the chip-mounting surface 111 at the second internal surface 240 of the carrier substrate 200 such that the beam direction 420 of the laser chip 400 is oriented in parallel to the first internal surface 230 and to the first outer surface 210 of the carrier substrate 200 as well as to the second internal surface 240 and to the second outer surface 220 of the carrier substrate 200 in the third laser component 30. Thus, in the third laser component 30, the laser chip 400 has been pivoted by 90° with regard to its orientation in the first laser component 10.

In the depiction of FIG. 6, the third laser component 30 is shown in a first mounting arrangement on the printed circuit board 500. In FIG. 6, the third laser component 30 is in a first side-looker arrangement. The first outer surface 210 of the carrier substrate 200 of the third laser component 30 faces the surface of the printed circuit board 500. The first soldering contact 112 of the third laser component 30 connects to the first soldering surface 510 of the printed circuit board 500 in an electrically conductive manner. The second soldering contact 122 of the third laser component 30 connects to the second soldering surface 520 of the printed circuit board 500 in an electrically conductive manner. The beam direction 420 of the laser chip 400 is oriented in parallel to the surface of the printed circuit board 500.

Figure 7:
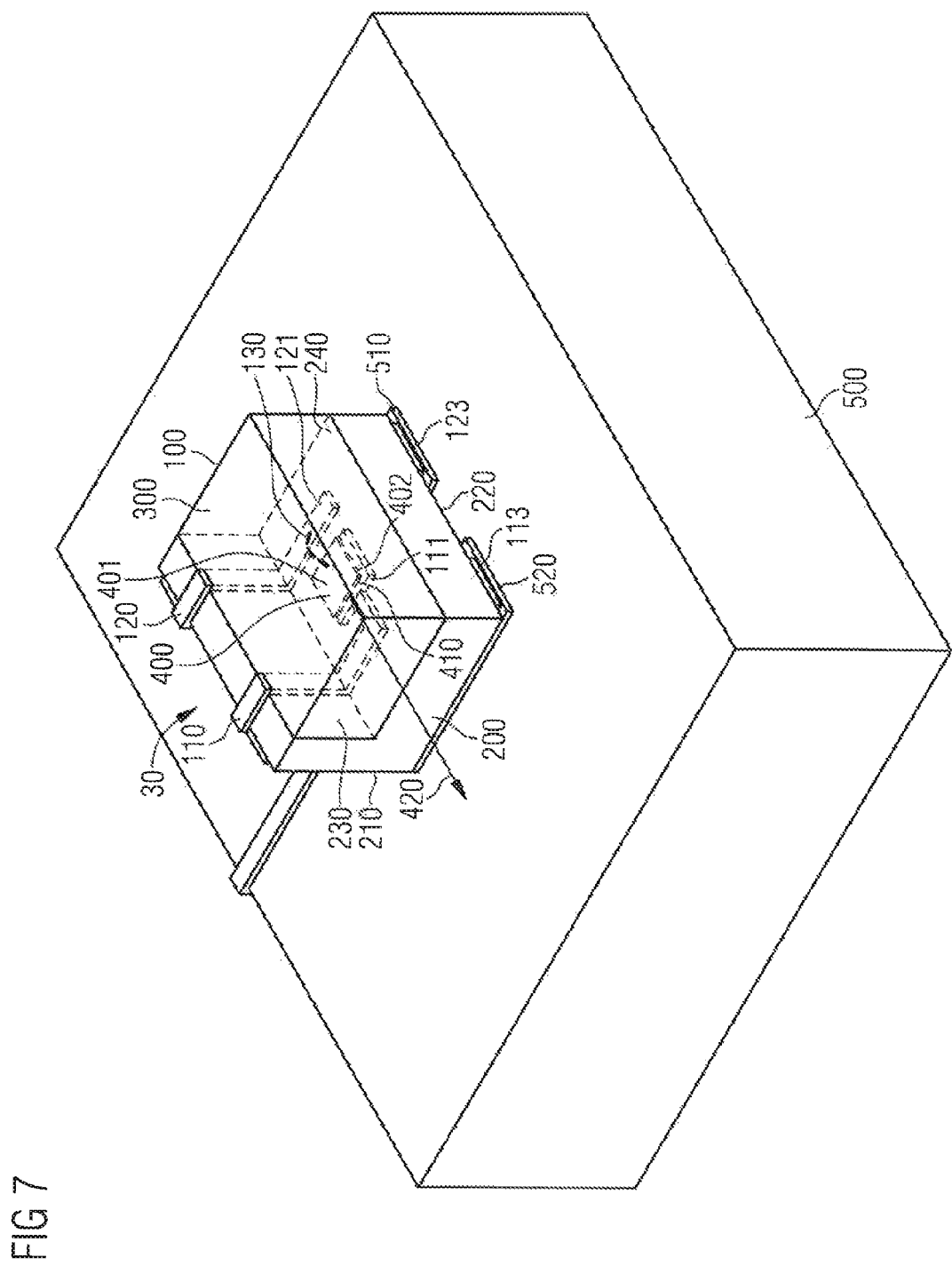
FIG. 7 shows the third laser component in a second mounting orientation.

FIG. 7 shows the third laser component 30 in a schematic view in a further side-looker arrangement. In FIG. 7, the second outer surface 220 of the carrier substrate 200 of the third laser component 30 faces the surface of the printed circuit board 500. The third soldering contact 113 of the third laser component 30 connects to the second soldering surface 520 of the printed circuit board 500 in an electrically conductive manner. The fourth soldering contact 123 of the third laser component 30 connects to the first soldering surface 510 of the third laser component 30 in an electrically conductive manner.

In the arrangement shown in FIG. 7, as well, the beam direction 420 of the laser chip 400 of the third laser component 30 is oriented in parallel to the surface of the printed circuit board 500. In the arrangement of FIG. 7, the laser facet 410 of the laser chip 400, however, is pivoted by 90° with regard to the arrangement of FIG. 6. As a result, a beam profile of a laser radiation emitted in the beam direction 420 by the laser chip 400 of the third laser component 30 in the arrangement of FIG. 7 is pivoted by 90° with regard to the arrangement of FIG. 6. The laser radiation emitted by the laser chip 400 may comprise a non-rotation-symmetric beam profile, e.g. an elliptic beam profile. The non-rotation-symmetric beam profile of the laser radiation emitted by the laser chip 400 is differently oriented in the arrangement of FIG. 6 than in the arrangement of FIG. 7.

The laser component 20 described in conjunction with FIG. 3, just as the first laser component 10, may be mounted in a side-looker or in a top-looker arrangement. The third laser component 30 of FIGS. 6 and 7 may comprise a second cover 310 instead of the first cover 300, just as the second laser component 20.

My laser components and methods have been depicted and described in detail in conjunction with preferred examples. However, this disclosure is not limited to the disclosed examples. Rather, those skilled in the art may derive other variants therefrom which do not exceed the protective scope of the appended claims.

What is claimed is:

1. A laser component comprising:
a housing and a laser chip arranged in the housing, wherein the housing comprises a first soldering contact and a second soldering contact at a first outer surface, and a third soldering contact and a fourth soldering contact at a second outer surface,
the first soldering contact connects to the third soldering contact in an electrically conductive manner and the second soldering contact connects to the fourth soldering contact in an electrically conductive manner,
the housing comprises a carrier substrate and a cover,
a bottom side of the laser chip is arranged on the carrier substrate,
the cover comprises an encapsulation material,
the laser chip is covered by the encapsulation material, and
a beam direction of the laser chip is oriented in parallel to the bottom side of the laser chip.

2. The laser component according to claim 1, wherein the first outer surface and the second outer surface are arranged perpendicular to each other.

3. The laser component according to claim 1, wherein the beam direction is oriented perpendicular to the first outer surface and in parallel to the second outer surface.

4. The laser component according to claim 1, wherein the beam direction is oriented in parallel to the first outer surface and to the second outer surface.

5. The laser component according to claim 1, wherein the first outer surface and the second outer surface are formed by the carrier substrate.

6. The laser component according to claim 1, wherein the laser component is configured as a surface-mountable component.

7. A method of producing a laser component comprising:
producing a carrier substrate having a first outer surface and a second outer surface;
arranging a first soldering contact and a second soldering contact at the first outer surface,
arranging a third soldering contact and a fourth soldering contact at the second outer surface,
wherein the first soldering contact connects to the third soldering contact in an electrically conductive manner and the second soldering contact connects to the fourth soldering contact in an electrically conductive manner;

arranging a bottom side of a laser chip on the carrier substrate, wherein a beam direction of the laser chip is oriented in parallel to the bottom side of the laser chip; and covering the laser chip by a cover formed by encapsulating the laser chip in an encapsulation material.

8. The method according to claim 7, wherein the carrier substrate is produced by injection molding.

9. The method according to claim 7, wherein the laser chip is arranged on the carrier substrate such that the beam direction is oriented perpendicular to the first outer surface and in parallel to the second outer surface.

10. The method according to claim 7, wherein the laser chip is arranged on the carrier substrate such that the beam direction is oriented in parallel to the first outer surface and to the second outer surface.

* * * * *